(12) United States Patent
Bianxiao

(10) Patent No.: US 8,129,491 B2
(45) Date of Patent: *Mar. 6, 2012

(54) SILOXANE RESIN COATING

(75) Inventor: Zhong Bianxiao, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/903,481

(22) Filed: Oct. 13, 2010

(65) Prior Publication Data

US 2011/0034629 A1 Feb. 10, 2011

Related U.S. Application Data

(63) Continuation of application No. 11/666,821, filed on May 1, 2007, now Pat. No. 7,838,615, which is a continuation of application No. PCT/US2005/034236, filed on Sep. 23, 2005.

(60) Provisional application No. 60/637,001, filed on Dec. 17, 2004.

(51) Int. Cl.
C08G 77/12 (2006.01)

(52) U.S. Cl. ............ 528/31; 528/43; 427/387

(58) Field of Classification Search .......... 528/31, 528/43; 427/387
See application file for complete search history.

(56) References Cited

U.S. PATENT DOCUMENTS

| | | | |
|---|---|---|---|
| 4,587,138 A | 5/1986 | Yau et al. | |
| 5,100,503 A | 3/1992 | Allman et al. | |
| 5,422,223 A | 6/1995 | Sachdev et al. | |
| 5,691,396 A | 11/1997 | Takemura et al. | |
| 6,057,239 A | 5/2000 | Wang et al. | |
| 6,087,064 A | 7/2000 | Lin et al. | |
| 6,143,855 A | 11/2000 | Hacker et al. | |
| 6,268,457 B1 | 7/2001 | Kennedy et al. | |
| 6,344,284 B1 | 2/2002 | Chou | |
| 6,359,096 B1 | 3/2002 | Zhong et al. | |
| 6,365,765 B1 | 4/2002 | Baldwin et al. | |
| 6,368,400 B1 | 4/2002 | Baldwin et al. | |
| 6,420,088 B1 | 7/2002 | Angelopoulos et al. | |
| 6,424,039 B2 | 7/2002 | Wang et al. | |
| 6,503,692 B2 | 1/2003 | Angelopoulos et al. | |
| 6,506,497 B1 | 1/2003 | Kennedy et al. | |
| 6,576,681 B2 | 6/2003 | Zampini et al. | |
| 6,589,711 B1 | 7/2003 | Subramanian et al. | |
| 6,589,862 B2 * | 7/2003 | Wang et al. | 438/622 |
| 6,596,404 B1 * | 7/2003 | Albaugh et al. | 428/447 |
| 6,596,405 B2 | 7/2003 | Zampini et al. | |
| 6,599,951 B2 | 7/2003 | Zampini et al. | |
| 6,605,362 B2 | 8/2003 | Baldwin et al. | |
| 6,730,454 B2 | 5/2004 | Pfeiffer et al. | |
| 6,746,530 B2 | 6/2004 | Wang | |
| 7,838,615 B2 * | 11/2010 | Zhong | 528/31 |
| 2001/0036998 A1 | 11/2001 | Sakamoto et al. | |
| 2002/0025495 A1 | 2/2002 | Ogata et al. | |
| 2002/0042020 A1 | 4/2002 | Gallagher et al. | |
| 2002/0055000 A1 | 5/2002 | Kennedy et al. | |
| 2002/0065331 A1 | 5/2002 | Zampini et al. | |
| 2002/0095018 A1 | 7/2002 | Baldwin et al. | |
| 2002/0128388 A1 | 9/2002 | Kennedy et al. | |
| 2002/0187422 A1 | 12/2002 | Angelopoulos et al. | |
| 2002/0198269 A1 | 12/2002 | Zampini et al. | |
| 2003/0022953 A1 | 1/2003 | Zampini et al. | |
| 2003/0120018 A1 | 6/2003 | Baldwin et al. | |
| 2003/0199659 A1 | 10/2003 | Baldwin et al. | |
| 2004/0138399 A1 * | 7/2004 | MacKinnon et al. | 528/31 |

FOREIGN PATENT DOCUMENTS

| | | |
|---|---|---|
| EP | 1197511 | 4/2002 |
| EP | 1197998 | 4/2002 |
| JP | 2004-531603 A | 10/2004 |
| WO | 0077575 | 12/2000 |
| WO | 0206402 | 1/2002 |
| WO | 03/011945 A2 | 2/2003 |
| WO | 03044077 | 5/2003 |
| WO | 03044078 | 5/2003 |
| WO | 03044079 | 5/2003 |
| WO | 03044600 | 5/2003 |
| WO | 03089992 | 10/2003 |
| WO | 2004007192 | 1/2004 |
| WO | 2004044025 | 5/2004 |
| WO | 2004/051376 | 6/2004 |
| WO | 2004113417 | 12/2004 |
| WO | 2006/065316 | 6/2006 |
| WO | 2006/065320 | 6/2006 |

* cited by examiner

Primary Examiner — Margaret Moore
(74) Attorney, Agent, or Firm — Howard & Howard Attorneys PLLC

(57) ABSTRACT

A siloxane resin having the formula: $(HSiO_{3/2})_a(RSiO_{3/2})_b(SiO_{4/2})_c$ where R is Z, $Z(CH_2)_n$ or $ZO(CH_2)_n$ where Z is a phenyl or substituted phenyl group; n has a value of 1 to 6, a has a value of 0.01 to 0.7, b has a value of 0.05 to 0.7, c has a value of 0.1 to 0.9 and $a+b+c \approx 1$. The siloxane resins are useful in anti-reflective coating compositions.

29 Claims, No Drawings

SILOXANE RESIN COATING

CROSS-REFERENCE TO RELATED APPLICATIONS

This application is a continuation of Ser. No. 11/666,821 filed on May 1, 2007, now U.S. Pat. No. 7,838,615, which claims priority to and the benefit of PCT International Patent Application No. PCT/US2005/034236, filed on Sep. 23, 2005, and U.S. Provisional Patent Application No. 60/637,001, filed on Dec. 17, 2004.

This invention relates to siloxane resin useful in antireflective coating compositions for use in fabricating semiconductor devices. The siloxane resins have the formula $(HSiO_{3/2})_a(RSiO_{3/2})_b(SiO_{4/2})_c$ where R is Z, $Z(CH_2)_n$ or $ZO(CH_2)_n$ where Z is a phenyl or substituted phenyl group; n has a value of 1 to 6, a has value of 0.01 to 0.7, b has a value of 0.05 to 0.7, c has a value of 0.1 to 0.9 and $a+b+c\approx1$.

Photolithography is a known technique in the art of semiconductor fabrication. In a typical photolithography process, a semiconductor wafer is coated with a barrier layer, i.e. an anti-reflective coating (ARC) layer. Thereafter, a photoresist layer is coated on the ARC layer. The photoresist/ARC/semiconductor wafer is then brought into proximity to a source of electromagnetic radiation, typically ultraviolet light (UV) having a wavelength from about 150 nm to about 300 nm, and a mask is interposed between the electromagnetic radiation source and the photoresist/ARC/semiconductor wafer. The mask is generally opaque to the wavelength of electromagnetic radiation used, but has transparent regions defining a desired pattern to be imparted to the photoresist layer.

When the source emits electromagnetic radiation, the mask allows exposure of electromagnetic radiation to particular and user-defined regions of the photoresist layer. Both positive photoresists and negative photoresists are known. In a positive photoresist, the regions of photoresist exposed to UV, as well as the regions of the ARC layer thereunder, will be sacrificed during subsequent developing steps. In a negative photoresist, the regions of photoresist that are not exposed to UV, as well as the regions of the ARC layer thereunder, will be sacrificed during subsequent developing steps.

Regardless of the details of the photolithography process, an ARC layer desirably has several properties. One property is a relatively high extinction coefficient, i.e., a relatively strong ability to absorb the wavelength of electromagnetic radiation used, rather than reflect the electromagnetic radiation up to the photoresist layer. A second property is a relatively low resistance to liquid stripping agents, such as diluted hydrofluoric acid, in order to be more quickly and easily removed after photolithography and minimize the extent of damage by a stripping agent to the low-k dielectric material on a wafer.

This invention relates to a siloxane resin having the formula $(HSiO_{3/2})_a(RSiO_{3/2})_b(SiO_{4/2})_c$ where R is Z, $Z(CH_2)_n$ or $ZO(CH_2)_n$ where Z is a phenyl or substituted phenyl group; n has a value of 1 to 6, a has value of 0.01 to 0.7, b has a value of 0.05 to 0.7, c has a value of 0.1 to 0.9 and $a+b+c\approx1$. The siloxane resins are useful in anti-reflective coating compositions.

This invention also relates to a method for preparing the siloxane resin, wherein the method comprises reacting $HSiX_3$, $RSiX_3$, $SiX_4$ and water in an organic solvent, where X is a hydrolyzable group independently selected from Cl, Br, $CH_3CO_2$—, an alkoxy group having 1 to 6 carbon atoms, or other hydrolyzable groups.

This invention relates to a method of preparing an anti-reflective coating on a substrate, comprising coating a composition onto a substrate to form a coated substrate, wherein the composition comprises a siloxane resin having the formula $(HSiO_{3/2})_a(RSiO_{3/2})_b(SiO_{4/2})_c$ where R is Z, $Z(CH_2)_n$ or $ZO(CH_2)_n$ where Z is a phenyl or substituted phenyl group; n has a value of 1 to 6, a has value of 0.01 to 0.7, b has a value of 0.05 to 0.7, c has a value of 0.1 to 0.9 and $a+b+c\approx1$; and curing the coated substrate, to form the anti-reflective coating on the substrate.

This invention relates to a semiconductor wafer, prepared according to the above method of preparing an anti-reflective coating on a substrate.

The siloxane resins of the present invention provide ARC layers having relatively high extinction coefficients for UV having wavelengths from about 150 nm to about 220 nm, and a relatively low resistance to liquid stripping agents such as a solution containing fluoride salt, (a high wet etch rate).

The siloxane resin is comprised of $HSiO_{3/2}$, $SiO_{4/2}$ and $RSiO_{3/2}$ units. A proportion of the units in the resin comprise one or more silanol or alkoxy (Si—OH or Si—OR' when the solvent is R'OH such as 1-methoxy-2-propanol) moieties. Typically 10-40% of the units in the resin contain silanols or alkoxy moieties.

In the siloxane resin a has a value of 0.01 to 0.7, alternatively 0.2 to 0.5, b has a value of 0.05 to 0.7, alternatively 0.15 to 0.35, c has a value of 0.1 to 0.9, alternatively 0.25 to 0.6 with the provision that a+b+c is approximately equal to 1. One skilled in the art will recognize that other units, (e.g. M and D units) may be present in the resin due to impurities in the starting materials or rearrangement during the production of the resin. The siloxane resins typically have a weight-average molecular weight of 2000 to 200000, alternatively 3000 to 15000.

In the siloxane resin, R is selected from Z, $Z(CH_2)_n$ or $ZO(CH_2)_n$ where Z is a phenyl or substituted phenyl group. Substituted phenyl groups contain at least one HO—, MeO—, Me-, Et- Cl— and/or other substituents. R may be exemplified by, but not limited to, $(2-HO)PhCH_2CH_2CH_2$—, $PhCH_2CH_2$—, and Ph where Ph represents a phenyl group.

This invention relates to a method for preparing a siloxane resin wherein the method comprises reacting water, $HSiX_3$, $RSiX_3$ and $SiX_4$ in an organic solvent, where X is a hydrolyzable group independently selected from Cl, Br, $CH_3CO_2$—, an alkoxy group having 1 to 6 carbon atoms, or other hydrolyzable groups. The silanes useful herein can be exemplified by, but not limited to, $HSi(OEt)_3$, $HSiCl_3$, $Si(OEt)_4$, $SiCl_4$, $(2-HO)C_6H_4CH_2CH_2CH_2Si(OEt)_3$, $PhCH_2CH_2SiCl_3$, and $PhSiCl_3$ where Et represents an ethyl group and Ph represents a phenyl group.

The amount of silane reactants ($HSiX_3$, $RSiX_3$ and $SiX_4$) in the reaction mixture is such that there is typically 1 to 70 mole %, alternatively 20 to 50 mole % $HSiX_3$; 5 to 70 mole %, alternatively 15 to 35 mole % $RSiX_3$, and 10 to 90 mole %, alternatively 25 to 60 mole % $SiX_4$ with the provision that the amount of $HSiX_3$, $RSiX_3$ and $SiX_4$ is approximately 100 mole % based on the total moles of $HSiX_3$, $RSiX_3$ and $SiX_4$.

The amount of water in the reaction is typically in the range of 0.5 to 2 moles water per mole of X groups in the silane reactants, alternatively 0.5 to 1.5 moles per mole of X groups in the silane reactants.

It is preferred to carry out the reaction for a time sufficient for essentially all of the X groups to undergo hydrolysis reactions. The reaction time will depend upon the silane reactants and the reaction temperature. Typically the reaction time is from minutes to hours, alternatively 10 minutes to 1 hour. The temperature at which the reaction is carried out is typically in the range of 25° C. up to the reflux temperature of the reaction mixture. Typically the reaction is carried out by heating under reflux for 10 minutes to 1 hour.

The reaction step comprises both hydrolyzing and condensing the silane components. To facilitate the completion of the reaction a catalyst may be used. The catalyst can be a base or an acid such as a mineral acid. Useful mineral acids include, but are not limited to, HCl, HF, HBr, $HNO_3$, and $H_2SO_4$, among others, typically HCl. The benefit of HCl or other volatile acids is that a volatile acid can be easily removed from the composition by stripping after the reaction is completed. The amount of catalyst may depend on its nature. The amount of catalyst is typically 0.05 wt % to 1 wt % based on the total weight of the reaction mixture.

Generally, the silane reactants are either not soluble in water or sparingly soluble in water. In light of this, the reaction is carried out in an organic solvent. The organic solvent is present in any amount sufficient to dissolve the silane reactants. Typically the organic solvent is present from 1 to 99 weight percent, alternatively 70 to about 99 wt % based on the total weight of the reaction mixture. Suitable organic solvents include, but are not limited to, THF, ethanol, propanol, 1-methoxy-2-propanol, 2-ethoxyethanol, MIBK, propylene methyl ether acetate and cyclohexanone.

In the process for making the siloxane resin, after the reaction is complete, volatiles may be removed from the siloxane resin solution under reduced pressure. Such volatiles include alcohol by-products, excess water, catalyst and solvents. Methods for removing volatiles are known in the art and include, for example, distillation or stripping under reduced pressure.

To increase the molecular weight of the siloxane resin and/or to improve the storage stability of the siloxane resin the reaction may be carried out for an extended period of time with heating from 40° C. up to the reflux temperature of the solvent ("bodying step"). The bodying step may be carried out subsequent to the reaction step or as part of the reaction step. Preferably, the bodying step is carried out for a period of time in the range of 10 minutes to 6 hours, more preferably 20 minutes to 3 hours.

This invention also relates to a anti-reflective coating composition comprising (A) a siloxane resin having the formula $(HSiO_{3/2})_a$ $(RSiO_{3/2})_b(SiO_{4/2})_c$ where R is Z, $Z(CH_2)_n$ or $ZO(CH_2)_n$ where Z is a phenyl or substituted phenyl group; n has a value of 1 to 6, a has a value of 0.01 to 0.7, b has a value of 0.05 to 0.7, c has a value of 0.1 to 0.9 and $a+b+c\approx1$; and (B) a solvent.

Useful solvents include, but are not limited to, 1-methoxy-2-propanol, and propylene methyl ether acetate and cyclohexanone, among others. The anti-reflective coating composition typically comprises from about 10% to about 99.9 wt % solvent based on the total weight of the composition, alternatively 80 to 95 wt %.

The anti-reflective coating composition can further comprise a cure catalyst. Suitable cure catalysts include inorganic acids, photo acid generators and thermal acid generators. Cure catalysts may be exemplified by, but not limited to sulfuric acid ($H_2SO_4$), (4-Methylthiophenyl)methyl phenyl sulfonium triflate and 2-Naphthyl diphenylsulfonium triflate. Typically a cure catalyst is present in an amount of up to 1000 ppm, alternatively 500 ppm.

The anti-reflective coating composition can further comprise additional components useful in coating applications or in other applications for which the composition can be used. In one embodiment, the composition further comprises water. The composition can comprise from about 0% to about 5% water by weight.

This invention relates to a method of preparing an anti-reflective coating on a substrate, comprising:

(I) applying an anti-reflective coating composition onto a substrate to form a coated substrate, wherein the anti-reflective coating composition comprises (A) a siloxane resin having the formula siloxane resin having the formula $(HSiO_{3/2})_a(RSiO_{3/2})_b(SiO_{4/2})_c$ where R is Z, $Z(CH_2)_n$ or $ZO(CH_2)_n$ where Z is a phenyl or substituted phenyl group; n has a value of 1 to 6, a has value of 0.01 to 0.7, b has a value of 0.05 to 0.7, c has a value of 0.1 to 0.9 and $a+b+c\approx1$; and (B) a solvent and (II) curing the coated substrate, to form the anti-reflective coating on the substrate.

The substrate can be any material. Typically the substrate is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

Specific methods for application of the anti-reflective coating composition to the substrate include, but are not limited to, spin-coating, dip-coating, spay-coating, flow-coating, screen-printing and others. The preferred method for application is spin coating. Typically, coating involves spinning the substrate, such as at about 2000 RPM, and adding the anti-reflective coating composition to the surface of the spinning substrate.

The coated substrate is cured to form the anti-reflective coating on the substrate. Curing generally comprises heating the coated substrate to a sufficient temperature for a sufficient duration to lead to curing. For example, the coated substrate can be heated at 80° C. to 450° C. for 0.1 to 60 minutes, alternatively 150° C. to 225° C. for of 0.5 to 2 minutes. Any method of heating may be used during the curing step. For example, the coated substrate may be placed in a quartz tube furnace, convection oven or allowed to stand on hot plates.

To protect the siloxane resin of the coated composition from reactions with oxygen or carbon during curing, the curing step can be performed under an inert atmosphere. Inert atmospheres useful herein include, but are not limited to nitrogen and argon. By "inert" it is meant that the environment contain less than 50 ppm and preferably less than 10 ppm of oxygen. The pressure at which the curing and removal steps are carried out is not critical. The curing step is typically carried out at atmospheric pressure however, sub or super atmospheric pressures may work also.

In the instant invention the siloxane resins can be used to produce coatings that have unique coating, surface, optical and wet etching properties. They may be used to form thin films by spin-coating, are crosslinked and become solvent-resistant after a soft baking, have water contact angle between 55 and 75 degrees, absorbs light at a wavelength below 220 nm, and can be easily removed by wet etching.

Once cured, the substrate comprising the anti-reflective coating can be used in further substrate processing steps, such as photolithography.

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

In the following examples the film thickness (Th) was tested by using a Woollen M-2000D Ellipsometer. Film thickness reduced by PGMEA rinse (ΔTh) was tested by rinsing the film with propylene methyl ether acetate, baking the rinsed film at 180° C. for 20 seconds on a hotplate, and testing final film thickness. Water contact angle (WCA) on the film surface was tested by using VCA 2000 Video Contact Angle System. Optical extinction coefficient (k) and refractive index (n) at 193 nm were tested by using a Woollen VUV-VASE VU303 Ellipsometer. Wet etch rate was tested by etching the film with Ashland NE-89 stripper at room temperature for 1 minutes with gentle ultrasonic agitation.

EXAMPLE 1

A siloxane resin composition, $(HSiO_{3/2})_{0.35}(RSiO_{3/2})_{0.3}(SiO_{4/2})_{0.35}$ with R=2-HO_C$_6$H$_4$—CH$_2$CH$_2$CH$_2$—, was prepared by combining (A) 100 weight parts of 1-methoxy-2-propanol, (B) 2.65 weight parts of triethoxysilane, (C) 3.36 weight parts of tetraethoxysilane, (D) 4.12 weight parts of RSi(OEt)$_3$ and (E) 3.74 weight parts of 8.4 wt % HCl/H$_2$O mixture. The resulting solution was heated under reflux for 20 minutes and stripped in reduced pressure until 60.2 weight parts of solution remained. A 1% H$_2$SO$_4$ aqueous solution of 0.65 weight parts and water of 2.5 weight parts were added, and the solution was heated under reflux for 20 minutes. The final product is a light yellow solution.

The siloxane resin composition sample was filtered through an 0.2 um filter, spin-coated on Si wafers at 2000 RPM, baked at 200° C. for 1 minute on a hotplate to yield clear films. The results are summarized in Table 1.

Example 1 demonstrated that siloxane resin composition $(HSiO_{3/2})_{0.35}(RSiO_{3/2})_{0.3}(SiO_{4/2})_{0.35}$ with R=2-HO_C$_6$H$_4$—CH$_2$CH$_2$CH$_2$—, can lead to thin films that are resistant to PGMEA rinse, have a water contact angle between 55 and 75 degrees, strongly absorbs 193 nm light, and can be completely removed with a commercial stripper, Ashland NE-89.

TABLE 1

Thin film properties of sample Example 1.

| Example | Th, Å | ΔTh, Å | WCA, ° | k | n | Etch rate Å/min |
|---------|-------|--------|--------|------|------|-----------------|
| 1 | 2100 | 6 | 63 | 0.47 | 1.55 | >2100 |

EXAMPLES 2 AND 3

Siloxane resin compositions, $(HSiO_{3/2})_{0.49}(PhCH_2CH_2SiO_{3/2})_{0.16}(SiO_{4/2})_{0.35}$ (Example 2) and $(HSiO_{3/2})_{0.4}(PhSiO_{3/2})_{0.25}(SiO_{4/2})_{0.35}$ (Example 3) were prepared by combining in a glass container cooled with an ice-water bath components (A) 1-methoxy-2-propanol, (B) trichlorosilane, (C) tetrachlorosilane, (D) PhCH$_2$CH$_2$SiCl$_3$ or PhSiCl$_3$ and (E) water according to Table 2. The resulting solutions were heated under reflux for 20 minutes and stripped in reduced pressure until 50% of the total weight remained. Water in an amount of 1.5% of total original weight was added and 1-methoxy-2-propanol was added until the total weights were identical to the original total weights. The final products were clear solutions.

Thin films were processed from samples 2 and 3 and characterized using the same procedures discussed in Example 1 except that the sample Example 3 was spin-coated at 2600 RPM. The results were summarized in Table 3.

Examples 2 and 3 demonstrated that siloxane resin compositions, $(HSiO_{3/2})_{0.49}(PhCH_2CH_2SiO_{3/2})_{0.16}(SiO_{4/2})_{0.35}$ and $(HSiO_{3/2})_{0.4}(PhSiO_{3/2})_{0.25}(SiO_{4/2})_{0.35}$ can lead to thin films that are resistant to PGMEA rinse, have a water contact angle between 55 and 75 degrees, strongly absorbs 193 nm light, and can be completely removed with a commercial stripper, Ashland NE-89.

TABLE 2

Preparation of samples Example 2 and Example 3.

| Example | Wt. Parts (A) | Wt. Parts (B) | Wt. Parts (C) | Wt. Parts (D) | Wt. Parts (E) |
|---------|---------------|---------------|---------------|---------------|---------------|
| 2 | 100 | 6.61 | 5.97 | 3.94 | 6.66 |
| 3 | 100 | 6.28 | 6.89 | 6.13 | 7.69 |

TABLE 3

Thin film properties of samples Example 2 and Example 3.

| Example | Th, Å | ΔTh, Å | WCA, ° | k | n | Etch rate Å/min |
|---------|-------|--------|--------|------|------|-----------------|
| 2 | 2255 | 1 | 68 | 0.42 | 1.65 | >2255 |
| 3 | 2184 | 5 | 69.5 | 0.49 | 1.78 | >2184 |

COMPARATIVE EXAMPLES 4 AND 5

Siloxane resin compositions $(HSiO_{3/2})_{0.84}(PhCH_2CH_2SiO_{3/2})_{0.16}$ (Comp. Example 4) and $(HSiO_{3/2})_{0.75}(PhSiO_{3/2})_{0.25}$ (Comp. Example 5) were prepared by using the same procedures discussed in Examples 2 and 3 except that the weight parts for the components were different as shown in Table 4. The final products were both hazy solutions that could not be filtered through 0.2 um filter. Therefore neither of the compositions can be used as a coating composition.

TABLE 4

Preparation of samples Comparative Examples 4 and 5.

| Example | Wt. Parts (A) | Wt. Parts (B) | Wt. Parts (C) | Wt. Parts (D) | Wt. Parts (E) |
|---------|---------------|---------------|---------------|---------------|---------------|
| C4 | 100 | 12.23 | 0 | 4.24 | 6.42 |
| C5 | 100 | 12.65 | 0 | 6.59 | 7.39 |

Examples 2 and 3 and Comparative Examples 4 and 5 demonstrated that the $(SiO_{4/2})$ units in siloxane resin composition $(HSiO_{3/2})_a(RSiO_{3/2})_b(SiO_{4/2})_c$ can make it more stable or soluble.

COMPARATIVE EXAMPLES 6 AND 7

Siloxane resin compositions $(MeSiO3/2)_{0.49}(PhCH_2CH_2SiO_{3/2})_{0.16}(SiO_{4/2})_{0.35}$ (Comp. Example 6) and $(MeSiO_{3/2})_{0.4}(PhSiO_{3/2})_{0.25}(SiO_{4/2})_{0.35}$ (Comp. Example 7) were prepared by using the same procedures discussed in Examples 2 and 3 except that the component (B) was changed from HSiCl$_3$ to MeSi(OMe)$_3$ and the weight parts of the components were adjusted as shown in Table 5.

Thin films were processed from samples Comp. Example 6 and Comp. Example 7 using the same procedures discussed in Example 1. The results are shown in Table 6.

Examples 2 and 3 and Comparative Examples 6 and 7 demonstrated that the HSi-based siloxane resin composition $(HSiO_{3/2})_a(RSiO_{3/2})_b(SiO_{4/2})_c$ can lead to thin films that are more resistant to solvent rinse and have a lower water contact angle than the MeSi-based siloxane resin composition (MeSiO$_{3/2}$)$_a$(RSiO$_{3/2}$)$_b$(SiO$_{4/2}$)$_c$.

TABLE 5

Preparation of samples Comparative Examples 6 and 7.

| Example | Wt. Parts (A) | Wt. Parts (B) | Wt. Parts (C) | Wt. Parts (D) | Wt. Parts (E) |
|---|---|---|---|---|---|
| C6 | 100 | 5.97 | 5.36 | 3.54 | 5.99 |
| C7 | 100 | 5.78 | 6.32 | 5.61 | 7.04 |

TABLE 6

Thin film properties of samples Comparative Examples 6 and 7.

| Example | Th, Å | ΔTh, Å | WCA, ° |
|---|---|---|---|
| C6 | 1803 | 224 | 80.5 |
| C7 | 2490 | 1508 | 80 |

EXAMPLES 8 AND 9

Siloxane resin compositions, $(PhCH_2CH_2SiO_{3/2})_{0.185}$ $(SiO_{04/2})_{0.815}$ (Example 8) and $(PhSiO_{3/2})_{0.21}(SiO_{4/2})_{0.79}$ (Example 9) were prepared by combining in a glass container cooled with an ice-water bath components (A) 1-methoxy-2-propanol, (C) tetrachlorosilane, (D) PhCH$_2$CH$_2$SiCl$_3$ or PhSiCl$_3$ and (E) water according to Table 7. The resulting solutions were heated under reflux for 20 minutes and stripped in reduced pressure until 50% of the total weight remained. Water in an amount of 1.5% of total original weight was added and 1-methoxy-2-propanol was added until the total weights were identical to the original total weights. The final products were clear solutions.

Thin films were processed from samples 8 and 9 and characterized using the same procedures discussed in Example 1. The results were summarized in Table 8.

Examples 8 and 9 demonstrated that siloxane resin compositions, $(PhCH_2CH_2SiO_{3/2})_{0.185}(SiO_{4/2})_{0.815}$ and $(PhSiO_{3/2})_{0.21}(SiO_{4/2})_{0.79}$ can lead to thin films that are resistant to PGMEA rinse, have a water contact angle between 55 and 75 degrees, strongly absorbs 193 nm light, and can be completely removed with a commercial stripper, Ashland NE-89.

TABLE 7

Preparation of samples Example 8 and Example 9.

| Example | Wt. Parts (A) | Wt. Parts (B) | Wt. Parts (C) | Wt. Parts (D) | Wt. Parts (E) |
|---|---|---|---|---|---|
| 8 | 100 | 0 | 12.30 | 3.94 | 6.71 |
| 9 | 100 | 0 | 12.90 | 4.25 | 6.25 |

TABLE 8

Thin film properties of samples Example 8 and Example 9.

| Example | Th, Å | ΔTh, Å | WCA, ° | k | n | Etch rate A/min |
|---|---|---|---|---|---|---|
| 8 | 2059 | 4 | 71 | 0.38 | 1.68 | >2059 |
| 9 | 2156 | 8 | 71 | 0.39 | 1.76 | >2156 |

The invention claimed is:

1. A method for preparing an anti-reflective coating on a substrate, said method comprising
   (I) applying an anti-reflective coating composition onto a substrate to form a coated substrate, wherein the anti-reflective coating composition comprises
      (A) a siloxane resin having the formula $(HSiO_{3/2})_a$ $(RSiO_{3/2})_b(SiO_{4/2})_c$ where R is Z, Z(CH$_2$)$_n$ or ZO(CH$_2$)$_n$ where Z is a phenyl or substituted phenyl group; n has a value of 1 to 6, a has value of 0.2 to 0.5, b has a value of 0.15 to 0.35, c has a value of 0.25 to 0.6 and a+b+c≈1, and
      (B) a solvent selected from 1- methoxy-2-propanol, propylene methyl ether acetate and cyclohexanone; and
   (II) curing the coated substrate, to form the anti-reflective coating on the substrate.

2. The method as claimed in claim 1 wherein Z is substituted phenyl group and the substitution is selected from HO—, MeO—, CH$_3$—, CH$_3$CH$_2$—, and Cl—.

3. The method as claimed in claim 1 wherein R is selected from (2-OH)PhCH$_2$CH$_2$CH$_2$—, PhCH$_2$CH$_2$—, and Ph where Ph represents phenyl.

4. The method as claimed in claim 1 further comprising making the siloxane resin prior to application of the anti-reflective coating composition onto the substrate by:
   a) forming a reaction mixture comprising water, HSiX$_3$, RSiX$_3$ and SiX$_4$ and organic solvent, where X is a hydrolyzable group, R is Z, Z(CH$_2$)$_n$ or ZO(CH$_2$)$_n$, Z is a phenyl or substituted phenyl group, and n has a value of 1 to 6; and
   b) reacting the reaction mixture to produce the siloxane resin.

5. The method as claimed in claim 4 wherein the hydrolyzable group is selected from Cl, Br, CH$_3$CO$_2$—, and an alkoxy group having 1 to 6 carbon atoms.

6. The method as claimed in claim 4 wherein HSiX$_3$ is selected from HSi(OCH$_2$CH$_3$)$_3$ and HSiCl$_3$.

7. The method as claimed in claim 4 wherein RSiX$_3$ is selected from PhCH$_2$CH$_2$SiCl$_3$ and (2-OH)PhCH$_2$CH$_2$CH$_2$Si(OEt)$_3$ where Et represents an ethyl group and Ph represents a phenyl group.

8. The method as claimed in claim 4 wherein SiX$_4$ is selected from Si(OCH$_2$CH$_3$)$_4$, and SiCl$_4$.

9. The method as claimed in claim 1 where there is additionally present a cure catalyst selected from inorganic acids, photoacid generators and thermal acid generators.

10. The method as claimed in claim 9 wherein the cure catalyst is selected from sulfuric acid (H$_2$SO$_4$), (4-Methylthiophenyl)methyl phenyl sulfonium triflate and 2-Naphthyl diphenylsulfonium triflate.

11. The method as claimed in claim 1 wherein the substrate is a semiconductor device.

12. The method as claimed in claim 1 wherein the anti-reflective coating composition is applied by spin coating.

13. The method as claimed in claim 1 wherein the coated substrate is cured by heating at a temperature in the range of 80° C. to 450° C.

14. The method as claimed in claim 1 wherein the coated substrate is cured by heating at a temperature in the range of 150° C. to 225° C.

15. The method as claimed in claim 1 wherein the coated substrate is cured under an inert atmosphere.

16. A method for preparing an anti-reflective coating on a substrate, said method comprising
   (I) applying an anti-reflective coating composition onto a substrate to form a coated substrate, wherein the anti-reflective coating composition comprises (A) a siloxane resin having the formula $(HSiO_{3/2})_a (RSiO_{3/2})_b (SiO_{4/2})_c$ where R is Z, $Z(CH_2)_n$ or $ZO(CH_2)_n$ where Z is a phenyl or substituted phenyl group; n has a value of 1 to 6, a has a value of 0.2 to 0.5, b has a value of 0.15 to 0.35, c has a value of 0.25 to 0.6 and $a+b+c \neq 1$, (B) a solvent, and (C) a cure catalyst selected from inorganic acids, photoacid generators and thermal acid generators; and (II) curing the coated substrate, to form the anti-reflective coating on the substrate.

17. The method as claimed in claim 16 wherein the cure catalyst is selected from sulfuric acid ($H_2SO_4$), (4-Methylthiophenyl) methyl phenyl sulfonium triflate and 2-Naphthyl diphenylsulfonium triflate.

18. The method as claimed in claim 16 wherein Z is substituted phenyl group and the substitution is selected from HO—, MeO—, $CH_3$—, $CH_3CH_2$—, and Cl—.

19. The method as claimed in claim 16 wherein R is selected from (2-OH)$PhCH_2CH_2CH_2$—, $PhCH_2CH_2$—, and Ph where Ph represents phenyl.

20. The method as claimed in claim 16 wherein the substrate is a semiconductor device.

21. The method as claimed in claim 16 wherein the anti-reflective coating composition is applied by spin coating.

22. The method as claimed in claim 16 wherein the coated substrate is cured by heating at a temperature in the range of 80° C. to 450° C.

23. The method as claimed in claim 16 wherein the coated substrate is cured by heating at a temperature in the range of 150° C. to 225° C.

24. The method as claimed in claim 16 wherein the coated substrate is cured under an inert atmosphere.

25. The method as claimed in claim 16 further comprising making the siloxane resin prior to application of the anti-reflective coating composition onto the substrate by:

a) forming a reaction mixture comprising water, $HSiX_3$, $RSiX_3$ and $SiX_4$ and organic solvent, where X is a hydrolyzable group, R is Z, $Z(CH_2)_n$ or $ZO(CH_2)_n$, Z is a phenyl or substituted phenyl group, and n has a value of 1 to 6; and b) reacting the reaction mixture to produce the siloxane resin.

26. The method as claimed in claim 25 wherein the hydrolyzable group is selected from Cl, Br, $CH_3CO_2$—, and an alkoxy group having 1 to 6 carbon atoms.

27. The method as claimed in claim 25 wherein $HSiX_3$ is selected from $HSi(OCH_2CH_3)_3$ and $HSiCl_3$.

28. The method as claimed in claim 25 wherein $RSiX_3$ is selected from $PhCH_2CH_2SiCl_3$ and (2-OH)$PhCH_2CH_2CH_2Si(OEt)_3$ where Et represents an ethyl group and Ph represents a phenyl group.

29. The method as claimed in claim 25 wherein $SiX_4$ is selected from $Si(OCH_2CH_3)_4$, and $SiCl_4$.

* * * * *